United States Patent
Park et al.

(10) Patent No.: US 9,230,709 B2
(45) Date of Patent: Jan. 5, 2016

(54) PASTE COMPOSITION FOR ELECTRODE OF SOLAR CELL AND SOLAR CELL INCLUDING THE SAME

(75) Inventors: Jin Gyeong Park, Seoul (KR); Soon Gil Kim, Seoul (KR); Sun Mi Lee, Seoul (KR); Sang Gon Kim, Seoul (KR); Kyoung Hoon Chai, Seoul (KR); In Jae Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 475 days.

(21) Appl. No.: 13/333,365

(22) Filed: Dec. 21, 2011

(65) Prior Publication Data

US 2012/0171810 A1    Jul. 5, 2012

(30) Foreign Application Priority Data

Dec. 31, 2010    (KR) ........................ 10-2010-0140300

(51) Int. Cl.
*H01B 1/00* (2006.01)
*H01B 1/22* (2006.01)
*C03C 8/18* (2006.01)
*C03C 8/22* (2006.01)
*H01L 31/0224* (2006.01)
*H01B 1/20* (2006.01)

(52) U.S. Cl.
CPC .. *H01B 1/22* (2013.01); *C03C 8/18* (2013.01); *C03C 8/22* (2013.01); *H01L 31/022425* (2013.01); *Y02E 10/50* (2013.01)

(58) Field of Classification Search
USPC ............. 438/98; 257/E31.124; 252/512, 500, 252/514
See application file for complete search history.

(56) References Cited

U.S. PATENT DOCUMENTS

| | | | |
|---|---|---|---|
| 4,121,988 A * | 10/1978 | Sano et al. | ..................... 204/429 |
| 5,938,834 A * | 8/1999 | Boaz | ............................. 106/600 |
| 6,348,426 B1 | 2/2002 | Sanada et al. | |
| 6,841,495 B2 | 1/2005 | Tanaka et al. | |
| 2006/0119265 A1 | 6/2006 | Cho | |
| 2007/0290590 A1 | 12/2007 | Hoffman | |
| 2009/0229665 A1 | 9/2009 | Young et al. | |
| 2009/0255583 A1 | 10/2009 | Young et al. | |
| 2009/0298283 A1 | 12/2009 | Akimoto et al. | |
| 2010/0243048 A1 | 9/2010 | Laudisio et al. | |

FOREIGN PATENT DOCUMENTS

| | | |
|---|---|---|
| CN | 1695219 A | 11/2005 |
| CN | 1933183 | 3/2007 |
| CN | 101507066 A | 8/2009 |
| JP | 06-349314 | * 12/1994 |
| JP | 08-017671 A | 1/1996 |
| JP | 2000-100247 A | 4/2000 |
| TW | 2010-44414 A1 | 12/2010 |
| WO | WO 2009146398 A1 * | 12/2009 |

OTHER PUBLICATIONS

European Search Report dated Dec. 4, 2012 in European Application No. 11194599.4, filed Dec. 20, 2011.

(Continued)

*Primary Examiner* — Mark Kopec
*Assistant Examiner* — Danny N Kang
(74) *Attorney, Agent, or Firm* — Saliwanchik, Lloyd & Eisenschenk

(57) ABSTRACT

A paste composition for an electrode of a solar cell according to the present invention comprises a conductive powder, an organic vehicle, and a glass frit, and the glass frit includes a first glass frit having a first glass transition temperature and a second glass frit having a second glass frit temperature lower than the first glass transition temperature.

13 Claims, 1 Drawing Sheet

(56) References Cited

OTHER PUBLICATIONS

Office Action dated Sep. 7, 2012 in Korean Application No. 10-2010-0140300, filed Dec. 31, 2010.

Taiwanese Office Action dated Feb. 18, 2014 in Taiwanese Application No. 100148273.

Chinese Office Action dated Apr. 24, 2015 in Chinese Application No. 201110460505.2.

Office Action dated Oct. 19, 2015 in Chinese Application No. 201110460505.2.

* cited by examiner

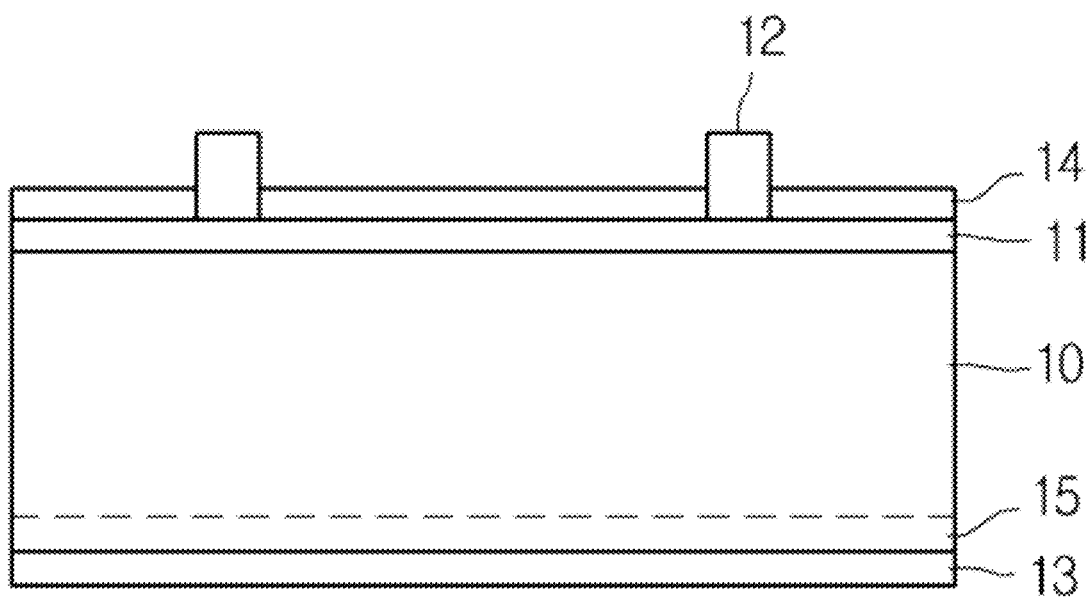

PASTE COMPOSITION FOR ELECTRODE OF SOLAR CELL AND SOLAR CELL INCLUDING THE SAME

CROSS-REFERENCE TO RELATED APPLICATION

This application claims the benefit under 35 U.S.C. §119 of Korean Patent Application No. 10-2010-0140300, filed Dec. 31, 2010, which is hereby incorporated by reference in its entirety.

BACKGROUND

The present disclosure relates to a paste composition for an electrode of a solar cell and a solar cell including an electrode prepared by using the paste composition.

Importance in the developments of next generation clean energies has been increased due to the depletion of fossil fuels in recent years. Among the clean energies, solar cells are expected as an energy source that can resolve future energy problems because of less pollution, unlimited resources, and semi-permanent lifespan.

Such solar cells may include front and rear electrodes formed on a silicon substrate. Paste compositions including conductive powders and glass frits are printed and then these electrodes may be formed by sintering. However, when sintering temperature ranges of the paste compositions are narrow, adhesions between the electrodes and the silicon substrate may decrease because sintering is not facilitated when there is a difference between a set sintering temperature and an actual sintering temperature. Therefore, a paste composition having a wide sintering temperature range is required.

BRIEF SUMMARY

Embodiments provide a paste composition for an electrode of a solar cell that may be sintered in a wide temperature range and have excellent electrical conductivity after sintering, and a solar cell including an electrode formed by using the paste composition.

In one embodiment, a paste composition for an electrode of a solar cell comprises: a conductive powder; an organic vehicle; and a glass frit, wherein the glass frit includes a first glass frit having a first glass transition temperature and a second glass frit having a second glass frit temperature lower than the first glass transition temperature.

The second glass transition temperature may be lower than the first glass transition temperature within a range of about 10° C. to about 50° C.

Any one of the first glass frit and the second glass frit may be included in an amount range of about 5 to 30 parts by weight based on 100 parts by weight of the glass frit, and the other one may be included in an amount range of about 70 to 95 parts by weight.

The glass frit may further comprise a third glass frit having a third glass transition temperature lower than the first and the second glass transition temperatures.

The second glass transition temperature may be lower than the first glass transition temperature within a range of about 10° C. to about 50° C.

The third glass transition temperature may be lower than the second glass transition temperature within a range of about 10° C. to about 50° C.

The second glass frit may be included in an amount more than a sum of the first glass frit and the third glass frit.

The second glass frit may be included in an amount range of about 70 to 95 parts by weight based on 100 parts by weight of the glass frit, and the sum of the first glass frit and the third glass frit may be included in an amount range of about 5 to 30 parts by weight based on 100 parts by weight of the glass frit.

The first glass frit may be included in an amount range of about 5 to 15 parts by weight based on 100 parts by weight of the glass frit, and the third glass frit may be included in an amount range of about 5 to 15 parts by weight based on 100 parts by weight of the glass frit.

About 50 to 90 parts by weight of the conductive powder, about 10 to 50 parts by weight of the organic vehicle, and about 1 to 20 parts by weight of the glass frit may be included based on 100 parts by weight of the paste composition.

The glass frit may be included in an amount range of about 3.5 to 4.5 parts by weight based on 100 parts by weight of the paste composition.

An average particle diameter (D50) of the glass frit may be in a range of about 1.0 µm to about 2.5 µm.

The conductive powder may include silver (Ag).

In another embodiment, a solar cell according to the present invention comprises an electrode formed by using the foregoing paste composition for an electrode of a solar cell.

The details of one or more embodiments are set forth in the accompanying drawings and the description below. Other features will be apparent from the description and drawings, and from the claims.

BRIEF DESCRIPTION OF THE DRAWINGS

FIG. 1 is a cross-sectional view illustrating a solar cell according to an embodiment.

DETAILED DESCRIPTION

In the description of embodiments, it will be understood that when a layer (or film), region, pattern or structure is referred to as being "on" and "under" another layer (or film), region, pad or pattern, the terminology of "on" and "under" includes both the meanings of "directly" and "indirectly".

Since the thickness or size of each layer (or film), region, pattern or structure in the drawings may be modified for convenience in description and clarity, the size of each element does not entirely reflect an actual size.

Hereinafter, a solar cell and a paste composition for an electrode (hereinafter, referred to as a "paste composition") used for the formation of an electrode of the solar cell according to the present invention will be described in detail.

An example of a solar cell to which a paste composition of the present invention is applicable will be described with reference to FIG. 1. FIG. 1 is a cross-sectional view illustrating a solar cell according to an embodiment.

Referring to FIG. 1, a solar cell includes a P-type silicon substrate 10 including an n-type semiconductor part 11 on a front surface thereof, a front electrode 12 electrically connected to the n-type semiconductor part 11, and a rear electrode 13 electrically connected to the P-type silicon substrate 10. An anti-reflective layer 14 may be formed on an upper surface of the n-type semiconductor part 11 except the front electrode 12. A back surface field (BSF) 15 may be formed on the silicon substrate 10 on which the rear electrode 13 is formed.

The paste composition of the present invention may be used for forming the foregoing front electrode 12 and rear electrode 13 of the solar cell. For example, in a paste composition for forming the front electrode 12, conductive powder may be a silver (Ag) powder, and in a paste composition for forming the rear electrode 13, conductive powder may be an aluminum (Al) powder. That is, the silicon substrate 10 is coated with the paste composition of the present invention and then the front electrode 12 or the rear electrode 13 may be formed by drying and sintering.

The foregoing paste composition may be dried at a temperature range of 80° C. to 200° C. for one minute to 30 minutes and may be sintered by a rapid heat treatment at a temperature range of 700° C. to 900° C.

The paste composition may include a conductive powder, an organic vehicle, and a glass frit, and may further include an additive or the like.

The conductive powder may be formed of a single powder or may be used by mixing powders having different characteristics.

The conductive powder may have a spherical shape. However, the present invention is not limited thereto and powders having a plate shape, a rod shape, or a flake shape may be included in the conductive powder.

An average particle diameter of the conductive powder may be in a range of 1 µm to 10 µm. When the average particle diameter is less than 1 µm, dispersion may not be facilitated because spaces between the conductive powders, in which an organic vehicle or the like may be introduced, are less. When the average particle diameter is greater than 10 µm, density may decrease and resistance may increase because many voids between the conductive powders exist. However, the present invention is not limited thereto, and conductive powders having various average particle diameters may be used.

The conductive powder may be included in an amount range of 50 to 90 parts by weight based on 100 parts by weight of the paste composition. When the conductive powder is included in an amount greater than 50 parts by weight, the composition may not be formed as a paste. When the conductive powder is included in an amount less than 90 parts by weight, electrical conductivity of the prepared front electrode 12 or rear electrode 13 may be low because the amount of the conductive powder decreases.

The organic vehicle may be formed by dissolving a binder in a solvent and may further include an antifoaming agent, a dispersant, etc. An organic solvent such as terpineol or carbitol may be used as the solvent, and an acryl-based resin, a cellulose-based resin, or an alkyd resin may be used as the binder. However, the present invention is not limited thereto, and various organic vehicles may be used.

At this time, the organic vehicle may be included in an amount range of 10 to 50 parts by weight based on 100 parts by weight of the paste composition. When the organic vehicle is included in an amount greater than 50 parts by weight, electrical conductivity of the prepared front electrode 12 or rear electrode 13 may be lowered because the amount of the conductive powder is small and printability may deteriorate because viscosity is low. When the organic vehicle is included in an amount less than 10 parts by weight, bonding characteristics with respect to the silicon substrate 10 may degrade and printability may deteriorate because viscosity increases.

Various compositions of glass frits such as a $PbO$—$SiO_2$ system, a $PbO$—$SiO_2$—$B_2O_3$ system, a $ZnO$—$SiO_2$ system, a $ZnO$—$B_2O_3$—$SiO_2$ system, or a $Bi_2O_3$—$B_2O_3$—$ZnO$—$SiO_2$ system may be used as the foregoing glass frit.

In the present invention, the glass frit includes at least two or more glass frits having different glass transition temperatures (Tg). A sintering temperature range of the paste composition may be widen by mixing the glass fits having different glass transition temperatures. That is, since a glass transition temperature is limited to a specific value when a single glass frit is used, sintering is not facilitated when an actual sintering temperature is slightly deviated from a set sintering temperature. However, when two types of glass frits are used as described above, sintering may be facilitated by a glass frit having different glass transition temperature even in the case where the actual sintering temperature is deviated from the set sintering temperature.

A glass transition temperature may be increased or decreased by adding a specific material. That is, the glass transition temperature may be increased by increasing the content of a network former able to form a network structure, e.g., $ZnO$, $B_2O_3$, and $Al_2O_3$. The glass transition temperature may be decreased by increasing the contents of PbO-based oxides or alkaline oxides such as $Li_2CO_3$.

For example, the glass frit may include a first glass frit having a first glass transition temperature and a second glass frit having a second glass frit temperature lower than the first glass transition temperature.

At this time, the second glass transition temperature may be lower than the first glass transition temperature in an amount range of 10° C. to 50° C. Herein, when a temperature difference is less than 10° C., an effect of widening a sintering temperature range may be insignificant. Since the sintering temperature is generally not deviated from a certain range, for example, 50° C., any one of the first and the second glass frits may not substantially function as a glass frit during a sintering process when the temperature difference is greater than 50° C. Therefore, any one of the first and the second glass frits acts as an oxide impurity and thus, resistance characteristics of the front electrode 12 or the rear electrode 13 may deteriorate.

A glass frit acting to assist sintering by widening a sintering temperature range among the first glass fit and the second glass frit may be included in an amount range of 5 to 30 parts by weight based on 100 parts by weight of the total glass frit. Herein, when the glass frit is included in an amount less than 5 parts by weight, the effect of widening a sintering temperature range may be insignificant, and when the glass frit is included in an amount greater than 30 parts by weight, resistance characteristics of the front electrode 12 or the rear electrode 13 may deteriorate because the amount of the auxiliary frit becomes large. Therefore, in order to improve the efficiency of the solar cell as well as the sintering temperature range, the glass frit acting to assist sintering may be included in an amount range of 5 to 30 parts by weight.

Accordingly, a major glass frit may be included in an amount range of 70 to 95 parts by weight based on 100 parts by weight of the total glass frit.

However, the present invention is not limited thereto, and a uniform sintering temperature may be obtained between two sintering temperatures by including the first glass frit and the second glass frit in a same amount of 50 parts by weight, respectively.

As another example, the glass frit may include a first glass frit having a first glass transition temperature, a second glass frit having a second glass transition temperature lower than the first glass transition temperature, and a third glass frit having a third glass transition temperature lower than the second glass transition temperature.

At this time, the second glass transition temperature may be lower than the first glass transition temperature in an amount range of 10° C. to 50° C., and the third glass transition temperature may be lower than the second glass transition temperature in an amount range of 10° C. to 50° C. Herein, when the temperature difference is less than 10° C., the effect of widening a sintering temperature range may be insignificant. Since any one of the first and the second glass frits may not substantially function as a glass frit when the temperature difference is greater than 50° C., resistance characteristics of the front electrode 12 or the rear electrode 13 may deteriorate.

Herein, since the second glass transition temperature is between the first glass transition temperature and the third glass transition temperature, the second glass frit may be used as a major glass frit and the first and the third glass fits may be used as a glass frit acting to assist sintering. Therefore, the second glass frit may be included in an amount more than a sum of the first glass frit and the third glass frit. Accordingly, the present invention may effectively cope when the actual sintering temperature is higher or lower than the set sintering temperature.

The glass frit acting to assist sintering, i.e., the first and the third glass frits, may be included in an amount range of 5 to 30 parts by weight based on 100 parts by weight of the total glass frit. Herein, when the glass frit is included in an amount less than 5 parts by weight, the effect of widening a sintering temperature range may be insignificant, and when the glass frit is included in an amount greater than 30 parts by weight, resistance characteristics of the front electrode 12 or the rear electrode 13 may deteriorate because the amount of the auxiliary frit becomes large. Therefore, in order to improve the efficiency of the solar cell as well as the sintering temperature range, the first and the third glass fits acting to assist sintering may be included in an amount range of 5 to 15 parts by weight, respectively.

Accordingly, the second glass frit as a major glass frit may be included in an amount range of 70 to 95 parts by weight based on 100 parts by weight of the total glass frit.

The foregoing description exemplifies a paste composition including two or three types of glass first, but the present invention is not limited thereto. Therefore, a paste composition including four or more types of glass frits may also pertain to the scope of the present invention.

An average particle diameter (D50) of the glass frit in the present invention may be in a range of 1.0 μm to 2.5 μm. Herein, when the average particle diameter of the glass frit is less than 1.0 μm, a preparation of the glass frit may be difficult and dispersion characteristics of the paste composition may deteriorate. When the average particle diameter is greater than 2.5 μm, a large amount of the glass frit is required because a smooth reaction does not occur during a sintering process and the resistance of the front electrode 12 or the rear electrode 13 may increase.

The glass frit may be included in an amount range of 1 to 20 parts by weight based on 100 parts by weight of the paste composition. In the foregoing range, the glass frit may improve adhesion and sinterability.

In the present invention, the glass frit may widen a sintering temperature range by including glass frits having different glass transition temperatures. Therefore, all desired characteristics may be achieved even in the case where the glass frit is included in an amount range of 3.5 to 4.5 parts by weight based on 100 parts by weight of the paste composition. Accordingly, the sintering temperature range may be widen without decreasing electrical conductivity. On the other hand, zinc oxide (ZnO) typically added to widen the sintering temperature range may decrease electrical conductivity.

In the present invention, since a sintering margin may be made large, a degree of freedom may be improved and the failure rate of the front electrode 12 or the rear electrode 13 may be minimized even in the case where sintering temperature is changed during a process. In particular, when the paste composition of the embodiment is used as a paste composition for the formation of the front electrode 12 having a most sensitive sintering condition, an improvement in the degree of freedom in sintering and an effect of minimizing the failure rate may be maximized.

Also, according to the present invention, sintering uniformity may be improved by performing sintering uniformly over the entire area of the silicon substrate 10. Therefore, a fill factor (FF) of the solar cell may improve and thus, the efficiency thereof may improve.

A dispersant, a thixotropic agent, a leveling agent, and an antifoaming agent may further be included as the additive. Polymer/organic materials, such as urea-based, amide-based, and urethane-based materials, or an inorganic material such as silica may be used as the thixotropic agent.

The additive may be included in an amount range of 0.1 to 10 parts by weight based on 100 parts by weight of the paste composition. In the foregoing range, electrical conductivity may be maintained at a high level because a sufficient amount of the conductive powder is added, and effects caused by the additive may be obtained.

The foregoing paste composition may be prepared by the following method.

A binder is dissolved in a solvent, and an organic vehicle is then formed by pre-mixing. Aging is performed for 1 hour to 12 hours by adding conductive powder and additive into the organic vehicle. At this time, a glass frit may be added together. The aged mixture is mechanically mixed and dispersed through a 3-roll mill. The mixture is filtered and degassed to prepare a paste composition. However, the foregoing method is merely provided as an example and the present invention is not limited thereto.

A method of preparing a solar cell including an electrode formed by using the foregoing paste composition is below.

A method of preparing a solar cell according to the embodiment includes: forming a front electrode on a substrate; and forming a rear electrode on the substrate, wherein the forming of the front electrode or the rear electrode includes coating a paste composition for an electrode of a solar cell, the paste composition includes a conductive powder, an organic vehicle, and a glass frit, the glass frit includes a first glass frit having a first glass transition temperature and a second glass frit having a second glass transition temperature lower than the first glass transition temperature, and the second glass transition temperature may be lower than the first glass transition temperature within a range of 10° C. to 50° C.

Also, any one of the first glass frit and the second glass frit may be included in an amount range of 5 to 30 parts by weight based on 100 parts by weight of the glass frit, and the other one may be included in an amount range of 70 to 95 parts by weight.

Further, the glass frit may further include a third glass frit having a third glass transition temperature lower than the first and the second glass transition temperatures, the second glass transition temperature may be lower than the first glass transition temperature within a range of 10° C. to 50° C., and the third glass transition temperature may be lower than the second glass transition temperature within a range of 10° C. to 50° C.

The second glass frit may be included in an amount range of 70 to 95 parts by weight based on 100 parts by weight of the glass frit, a sum of the first glass frit and the third glass frit may be included in an amount range of 5 to 30 parts by weight based on 100 parts by weight of the glass frit, the first glass frit may be included in an amount range of 5 to 15 parts by weight based on 100 parts by weight of the glass frit, and the third glass frit may be included in an amount range of 5 to 15 parts by weight based on 100 parts by weight of the glass frit.

A back surface field may be formed on the substrate on which the rear electrode is formed.

Hereinafter, the present invention will be described in more detail according to particular examples. However, the following examples are merely presented to exemplify the present invention, and the present invention is not limited thereto.

EXAMPLE 1

An organic vehicle was prepared by dissolving a binder in a solvent. A mixed solvent of diethylene glycol monobutyl ether acetate and a-terpineol was used as the solvent, and ethyl cellulose was used as the binder.

Conductive powder, glass frit, and additive were added into the organic vehicle and then mixed. The mixture was aged for 12 hours and secondary mixing and dispersion were then performed by using a 3-roll mill. The mixture was filtered and degassed to prepare a paste composition.

Silver powder was used as the conductive powder, and first, second, and third glass frits having different glass transition temperatures from one another were used as the glass frit.

A softening point (Tdsp) of the first glass frit was 392.8° C., a glass transition temperature thereof was 360.93° C., and a thermal expansion coefficient thereof was $78.4 \times 10^{-6}/°$ C. A softening point of the second glass frit was 374.44° C., a glass transition temperature thereof was 344.89° C., and a thermal expansion coefficient thereof was $124.0 \times 10^{-6}/°$ C. A softening point of the third glass frit was 348.0° C., a glass transition temperature thereof was 321.51° C., and a thermal expansion coefficient thereof was $120.3 \times 10^{-6}/°$ C. 10 parts by weight of the first glass frit, 80 parts by weight of the second glass frit, and 10 parts by weight of the third glass frit were included with respect to the total glass frit.

A 200 μm thick silicon substrate was coated with the foregoing paste composition by using a screen printing method, and then dried at 200° C. for 2 minutes. A front electrode was prepared by performing a rapid heat treatment at 900° C. for 30 seconds.

EXAMPLE 2

A front electrode was prepared in the same manner as Example 1 except that 20 parts by weight of the first glass frit, 60 parts by weight of the second glass frit, and 20 parts by weight of the third glass frit were included with respect to the total glass frit.

EXAMPLE 3

A front electrode was prepared in the same manner as Example 1 except that 30 parts by weight of the first glass frit, 40 parts by weight of the second glass frit, and 30 parts by weight of the third glass frit were included with respect to the total glass frit.

EXAMPLE 4

A front electrode was prepared in the same manner as Example 1 except that 50 parts by weight of the first glass frit and 50 parts by weight of the second glass frit were included with respect to the total glass frit and the third glass frit was not included.

Comparative Example

A front electrode was prepared in the same manner as Example 1 except that 100 parts by weight of the second glass frit having a softening point of 374.44° C., a glass transition temperature of 344.89° C., and a thermal expansion coefficient of $124.0 \times 10^{-6}/°$ C. was used.

Ten samples were respectively prepared according to Examples 1 to 3 and Comparative Example, and average efficiencies [%] of solar cells including the samples were measured when sintering temperatures were 880° C., 900° C., and 920° C. The results thereof are presented in Table 1.

TABLE 1

|  | Example 1 | Example 2 | Example 3 | Example 4 | Comparative Example |
|---|---|---|---|---|---|
| 880° C. | 16.93 | 16.83 | 16.75 | 16.75 | 16.73 |
| 900° C. | 17.2 | 16.8 | 16.7 | 17.15 | 16.9 |
| 920° C. | 17.13 | 16.83 | 16.96 | 17.2 | 16.92 |

Referring to Table 1, according to Examples 1 to 3, it may be understood that efficiencies at sintering temperatures of 880° C. and 920° C. were relatively excellent in comparison to those of Comparative Example. In particular, according to Examples 1 to 3, it may be understood that very excellent efficiencies at sintering temperatures of 880° C., 900° C., and 920° C. were obtained in comparison to those of Comparative Example. That is, it may be understood that a sintering temperature range may be effectively widen when the glass frit having an auxiliary role was included in an amount range of 5 to 30 parts by weight.

According to the present invention, a sintering temperature range may be widen without decreasing electrical conductivity by using at least two types of glass frits having different glass transition temperatures. That is, a large sintering margin may improve a degree of freedom in sintering and the failure rate of an electrode may be minimized even in the case where sintering temperature is changed during a process. In particular, when a paste composition of an embodiment is used as a paste composition for a front electrode having a most sensitive sintering condition, an improvement in the degree of freedom in sintering and an effect of minimizing the failure rate may be maximized.

Also, sintering uniformity may be improved by performing sintering uniformly over the entire area of a silicon substrate. Therefore, a fill factor (FF) of the solar cell may improve and thus, the efficiency thereof may improve.

Features, structures, or effects described in the foregoing embodiment are included in at least one embodiment of the present invention, and are not necessarily limited to only one embodiment thereof. Further, the features, structures, or effects exemplified in each embodiment may be combined or modified by those skilled in the art and implemented to other embodiments thereof. Therefore, descriptions related to such combinations and modifications will be construed as being included in the scope of the present invention.

Also, while this invention has been particularly shown and described with reference to preferred embodiments thereof, it will be understood by those skilled in the art that various changes in form and details may be made therein without departing from the spirit and scope of the invention as defined by the appended claims. The preferred embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. A paste composition for an electrode of a solar cell comprising:
   a conductive powder;
   an organic vehicle; and
   a glass frit composite;
   wherein the glass frit composite includes a first glass frit having a first glass transition temperature and a second glass frit having a second glass transition temperature lower than the first glass transition temperature, both the first glass transition temperature and the second glass transition temperature being lower than 450° C.;
   wherein the second glass transition temperature is lower than the first glass transition temperature within a range of 10° C. to about 50° C.;
   wherein the first glass frit acts to assist sintering by widening a sintering temperature range of the second glass frit;
   wherein the glass frit composite comprises about 5 to 30 parts by weight of the first glass frit per 100 parts by weight of the glass frit composite; and
   wherein the glass frit composite correspondingly comprises about 95 to 70 parts by weight of the second glass frit per 100 parts by weight of the glass frit composite.

2. The paste composition for an electrode of a solar cell according to claim 1, wherein the glass frit composite further comprises a third glass frit having a third glass transition temperature lower than the second glass transition temperature; and
   wherein the first and third glass frits act to assist sintering by widening the sintering temperature range of the second glass frit.

3. The paste composition for an electrode of a solar cell according to claim 2, wherein the second glass transition temperature is lower than the first glass transition temperature within a range of about 10° C. to about 50° C.

4. The paste composition for an electrode of a solar cell according to claim 2, wherein the third glass transition temperature is lower than the second glass transition temperature within a range of about 10° C. to about 50° C.

5. The paste composition for an electrode of a solar cell according to claim 2, wherein the second glass frit is included in an amount more than a sum of the first glass frit and the third glass frit.

6. The paste composition for an electrode of a solar cell according to claim 5, wherein the second glass fit is included in an amount range of about 70 to 95 parts by weight per 100 parts by weight the glass frit composite, and the sum of the first glass frit and the third glass fit is included in an amount range of about 5 to 30 parts by weight per 100 parts by weight of the glass frit composite.

7. The paste composition for an electrode of a solar cell according to claim 6, wherein the first glass fit is included in an amount range of about 5 to 15 parts by weight per 100 parts by weight of the glass fit composite, and the third glass fit is included in an amount range of about 5 to 15 parts by weight per 100 parts by weight of the glass frit composite.

8. The paste composition for an electrode of a solar cell according to claim 1, wherein about 50 to 90 parts by weight of the conductive powder, about 10 to 50 parts by weight of the organic vehicle, and about 1 to 20 parts by weight of the glass frit composite are included per 100 parts by weight of the paste composition.

9. The paste composition for an electrode of a solar cell according to claim 1, wherein the glass fit composite is included in an amount range of about 3.5 to 4.5 parts by weight per 100 parts by weight of the paste composition.

10. The paste composition for an electrode of a solar cell according to claim 1, wherein an average particle diameter (D50) of the glass frit composite is in a range of about 1.0 μm to about 2.5 μm.

11. The paste composition for an electrode of a solar cell according to claim 1, wherein the conductive powder includes silver (Ag) or aluminum (Al).

12. The paste composition for an electrode of a solar cell according to claim 1, further comprising:
    an additive including a dispersant, a thixotropic agent, a leveling agent, or an antifoaming agent.

13. The paste composition for an electrode of a solar cell according to claim 12, wherein about 0.1 to 10 parts by weight of the additive is included per 100 parts by weight of the paste composition.

* * * * *